United States Patent
Park

(10) Patent No.: US 7,547,909 B2
(45) Date of Patent: Jun. 16, 2009

(54) III-NITRIDE COMPOUND SEMICONDUCTOR LIGHT EMITTING DEVICE

(75) Inventor: Joongseo Park, Kyunggi-do (KR)

(73) Assignee: Epivalley Co., Ltd., Koomi (KR)

( * ) Notice: Subject to any disclaimer, the term of this patent is extended or adjusted under 35 U.S.C. 154(b) by 412 days.

(21) Appl. No.: 10/597,607

(22) PCT Filed: Mar. 5, 2005

(86) PCT No.: PCT/KR2005/000360

§ 371 (c)(1),
(2), (4) Date: Aug. 1, 2006

(87) PCT Pub. No.: WO2005/076374

PCT Pub. Date: Aug. 18, 2005

(65) Prior Publication Data

US 2008/0149917 A1 Jun. 26, 2008

(30) Foreign Application Priority Data

Feb. 5, 2004 (KR) .................. 10-2004-0007541

(51) Int. Cl.
*H01L 29/06* (2006.01)
*H01L 31/072* (2006.01)

(52) U.S. Cl. .............. 257/14; 257/15; 257/79; 257/98; 257/99; 257/E33.068; 257/E33.008; 257/E21.108; 257/E21.172

(58) Field of Classification Search ............ 257/14, 257/15, 79, 98, 94, 103, E33.068, E33.008, 257/E21.108, E21.172

See application file for complete search history.

(56) References Cited

U.S. PATENT DOCUMENTS

| 6,455,870 | B1 | 9/2002 | Wang et al. | |
|---|---|---|---|---|
| 7,193,246 | B1 | 3/2007 | Tanizawa et al. | |
| 2001/0009134 | A1 | 7/2001 | Kim et al. | |
| 2002/0179923 | A1* | 12/2002 | Morita et al. | 257/103 |
| 2002/0197827 | A1* | 12/2002 | Taki et al. | 438/478 |
| 2004/0051107 | A1* | 3/2004 | Nagahama et al. | 257/79 |
| 2004/0195579 | A1* | 10/2004 | Sonobe | 257/99 |
| 2005/0104080 | A1* | 5/2005 | Ichihara et al. | 257/98 |

(Continued)

FOREIGN PATENT DOCUMENTS

JP 9-83016 3/1997

(Continued)

*Primary Examiner*—Zandra Smith
*Assistant Examiner*—Telly D Green
(74) *Attorney, Agent, or Firm*—Darby & Darby P.C.

(57) ABSTRACT

The present invention relates to a III-nitride compound semiconductor light emitting device comprising an active layer with the multi-quantum wells interposed between an n-$In_x Al_y Ga_z N$ ($x+y+z=1$, $0<x<1$, $0<y<1$, $0<z \leq 1$) layer and a p-$In_x Al_y Ga_z N$ ($x+y+z=1$, $0<x<1$, $0<y<1$, $0<z<1$) layer, wherein the active layer comprises an alternate stacking of a quantum-well layer made of $In_x Ga_{1-x} N$ ($0.05<x<1$) and a sandwich barrier layer, the sandwich barrier layer comprising a first outer barrier layer of $In_a Ga_{1-a} N$ ($0<a<0.05$), a middle barrier layer of $Al_y Ga_{1-y} N$ ($0<y<1$) formed on the first outer barrier layer and a second outer barrier layer of $In_b Ga_{1-b} N$ ($0<b<0.05$) formed on the middle barrier layer, thereby a high-efficiency/high-output light emitting device with high-current and high-temperature properties can be obtained, and it is possible to easily achieve a high-efficiency green light emission at a wavelength equal to or over 500 nm, and high-efficiency near UV light emission.

4 Claims, 5 Drawing Sheets

U.S. PATENT DOCUMENTS

2005/0127391 A1* 6/2005 Yanamoto .................... 257/103
2005/0157765 A1* 7/2005 Johnson ........................ 372/39
2006/0289860 A1* 12/2006 Ichinose et al. ............... 257/43

FOREIGN PATENT DOCUMENTS

| JP | 09139543 | 5/1997 |
| JP | 9-266327 | 10/1997 |
| JP | 11-074622 | 3/1999 |
| JP | 2003150315 | 5/2003 |
| KR | 1020010077971 | 8/2001 |
| KR | 1020040047132 | 6/2004 |
| WO | WO-99/46822 | 9/1999 |
| WO | 2005034253 | 4/2005 |

* cited by examiner

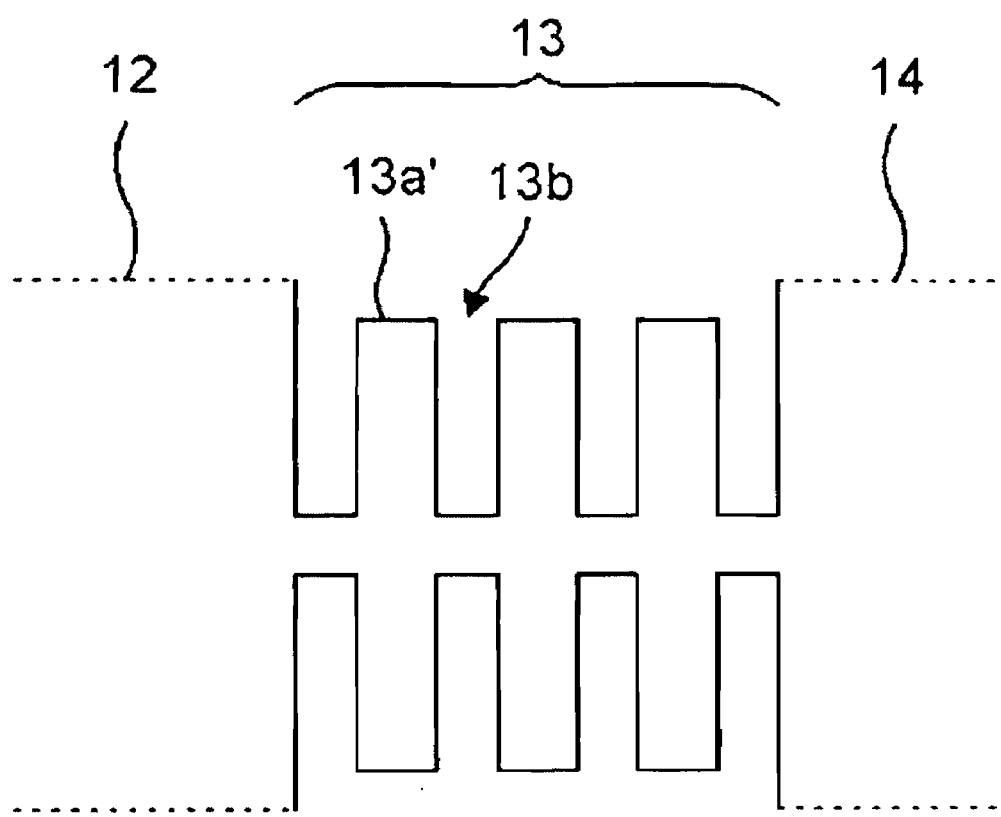

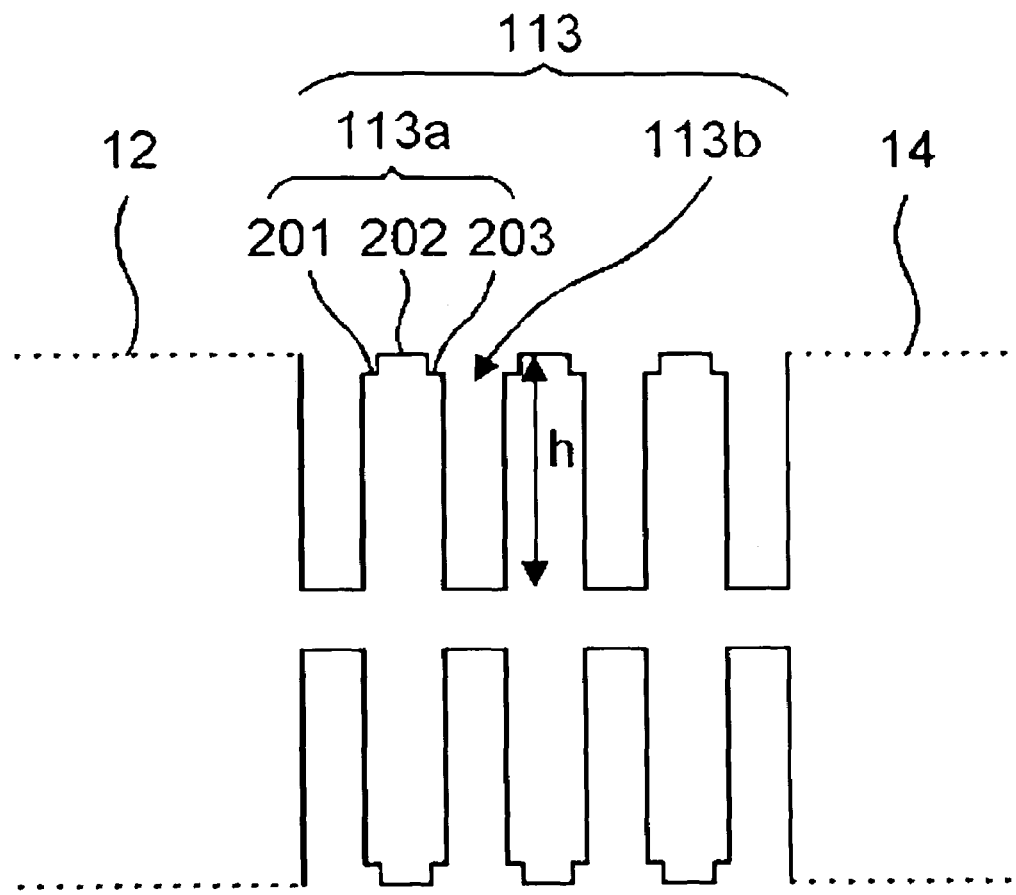
[Fig. 4]
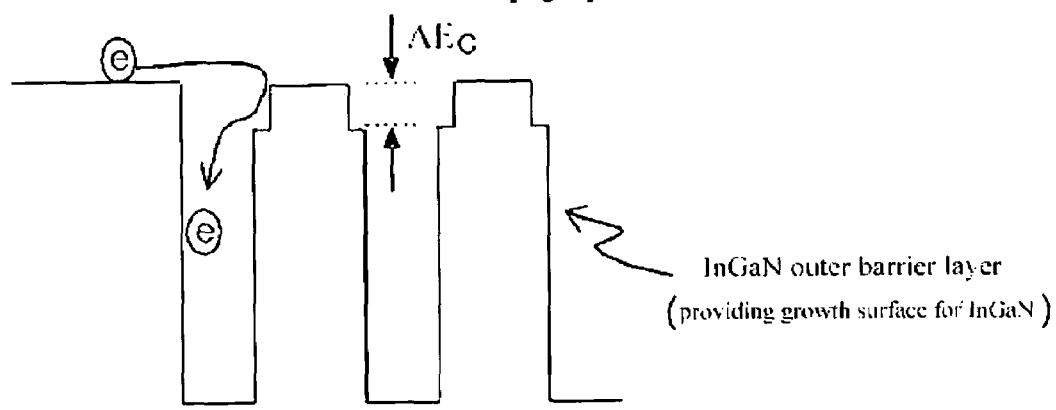
[Fig. 5]

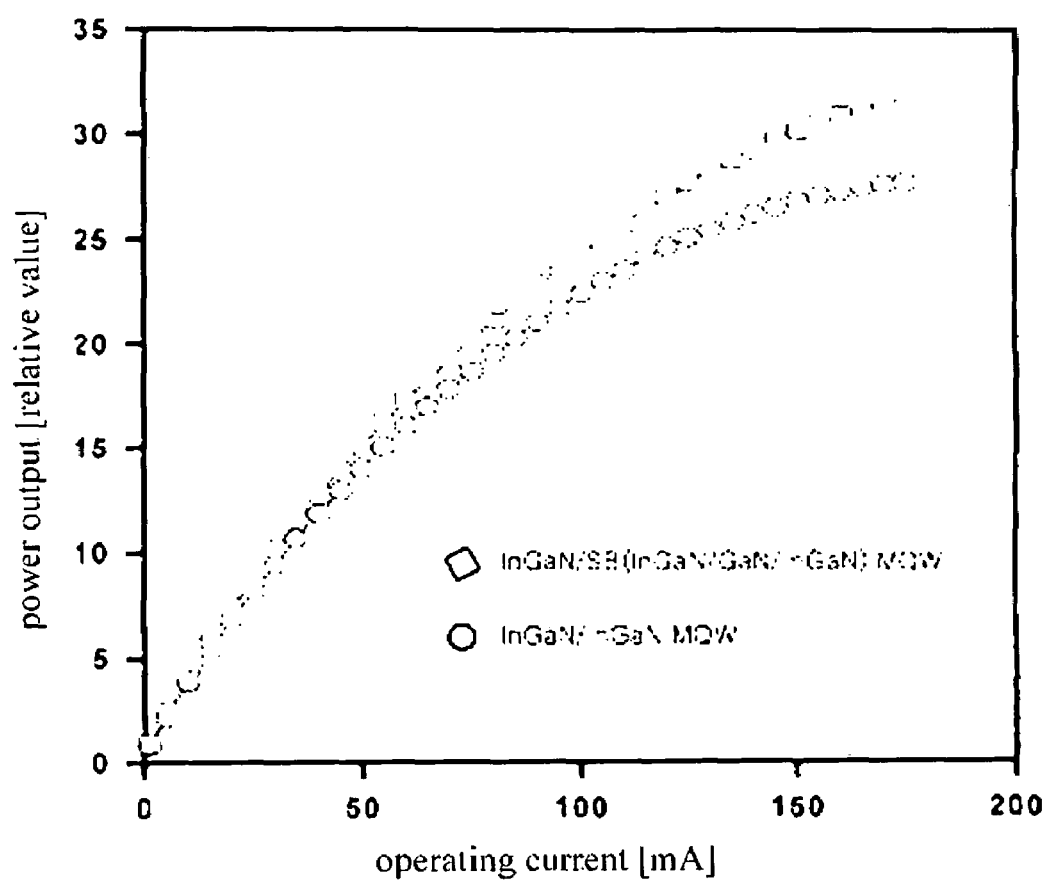
[Fig. 6]

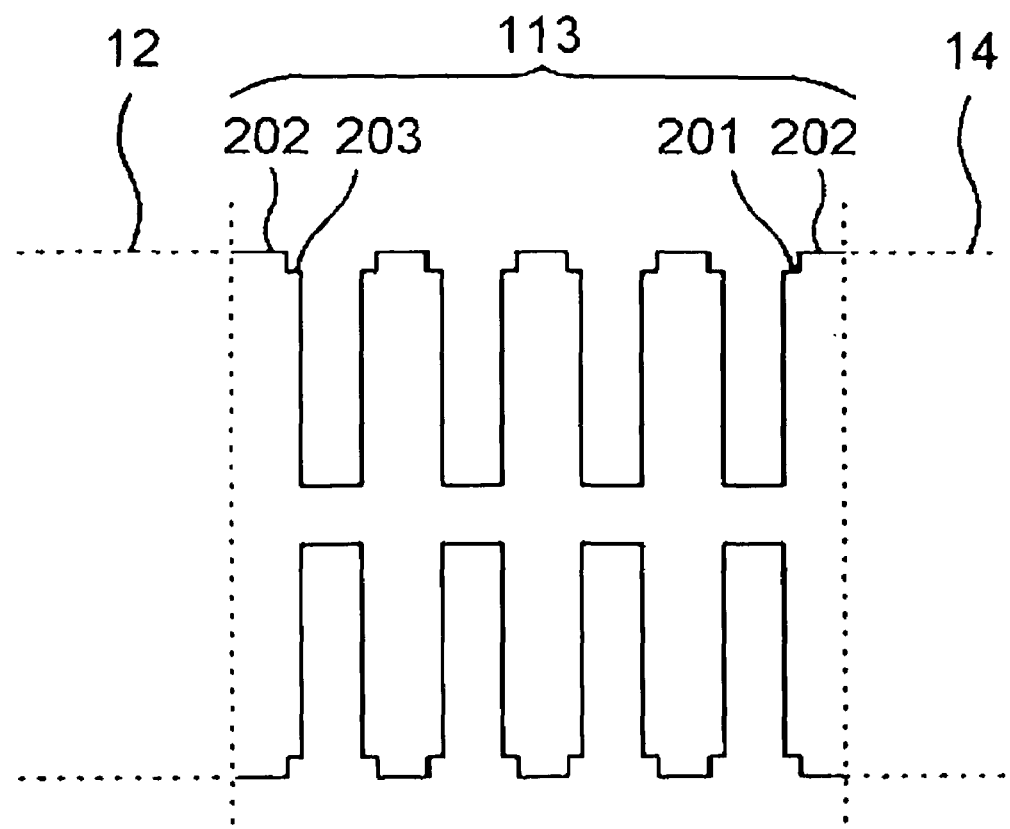
[Fig. 7]

III-NITRIDE COMPOUND SEMICONDUCTOR LIGHT EMITTING DEVICE

CLAIM OF PRIORITY

This application is a U.S. national phase application under 35 U.S.C. §371 of International Patent Application No. PCT/KR2005/000360 filed Feb. 5, 2005, and claims the benefit of priority of KR Patent Application No. 10-2004-0007541 filed Feb. 5, 2004. The International Application was published in English on Aug. 18, 2005 as WO 2005/076374.

TECHNICAL FIELD

The present invention relates to a III-nitride compound semiconductor light emitting device, and more particularly, to a III-nitride compound semiconductor light emitting device having a multiple-quantum-well (MQW) active layer comprising an alternate stacking of quantum well layers and sandwich barrier layer(s).

BACKGROUND ART

FIGS. 1 to 3 are drawing illustrating a III-nitride compound semiconductor light emitting device according to the prior art. Specifically, FIG. 1 is a cross-sectional view of the III-nitride compound semiconductor light emitting device, FIG. 2 is an energy band diagram showing that the active layer 13 has an InGaN/GaN multiple-quantum-well structure, and FIG. 3 is an energy band diagram showing that the active layer 13 has an InGaN/InGaN multiple-quantum-well structure.

Referring to FIG. 1, to fabricate a nitride compound semiconductor light emitting device according to the prior art, the buffer layer 11, the n-$In_xAl_yGa_zN$ layer 12, the active layer 13, the p-$In_xAl_yGa_zN$ layer 14 and the transparent electrode layer 15 are successively formed on the substrate 10. Then, mesa etching is performed in such a way to expose the n-$In_xAl_yGa_zN$ layer 12. Next, the transparent electrode layers 16 and 17 are formed on the exposed portion of the n-$In_xAl_yGa_zN$ layer 12 and the transparent electrode layer 12, respectively. Then, the passivation film 18 is formed on the device. In this respect, x, y and z in $In_xAl_yGa_zN$ forming the layers 12 and 14 satisfy the following conditions: $x+y+z=1$, $0 \leq x<1$, $0 \leq y<1$, and $0<z \leq 1$.

As shown in FIG. 2, the active layer 13 has an InGaN/GaN multiple-quantum-well structure having an alternate stacking comprising the InGaN quantum well layers 13b and the GaN barrier layers 13a. Alternatively, as shown in FIG. 3, the active layer 13 has an InGaN/InGaN multiple-quantum-well structure of an alternate stacking comprising the InGaN quantum well layers 13b and the InGaN barrier layers 13a'. In the InGaN/InGaN multiple-quantum-well structure, the barrier layers 13a' have a lower indium (In) content than that of the quantum well layers 13b.

The InGaN/GaN multiple-quantum-well active layer as shown in FIG. 2 has an advantage in that it is more stable in high-current operation or high-temperature operation than InGaN/InGaN. This is because the energy band gap of GaN forming the barrier layers 13a is higher than that of the barrier layers 13a', leading to an increase in the efficiency of recombination between electrons and holes.

However, the InGaN/GaN multiple-quantum-well active layer has a limitation in that the GaN barrier layers 13a should be grown at low temperature since the growth temperature of the InGaN well layers 13b is about 200-350° C. lower than the general growth temperature of high-quality GaN. This makes it difficult to make the GaN barrier layers 13a with high quality levels. Another disadvantage is that the strain of the InGaN well layers 13b and the GaN barrier layers 13a needs to be optimized only with-the thickness of the InGaN well layers 13b and the GaN barrier layers 13a.

In the other hand, in the case of the InGaN/InGaN multiple-quantum-well active layer as shown in FIG. 3, the barrier layers 13a' are also made of InGaN so that the InGaN barrier layers 13a' with high quality can be made at a growth temperature range similar to that of the InGaN well layers 13b. The InGaN barrier layers 13b made of the same material as the InGaN well layers 13b provide growth surfaces of the next well layers so that the InGaN well layers 13b with high quality can be obtained, leading to a light emitting device having high quantum efficiency.

However, the InGaN/InGaN multiple-quantum-well active layer has a disadvantage in that it has low stability in high-current or high-temperature operations as compared to the InGaN/GaN multiple-quantum-well layer. In an attempt to overcome this disadvantage, a p-AlGaN electron-blocking layer is generally formed on the active layer so as to increase the high-temperature stability and efficiency of the active layer. However, this approach has a disadvantage in that, in epitaxial growth of the nitride compound, the deposition of an aluminum (Al)-containing nitride compound, which is difficult to remove easily, occurs within a reactor. This results in a great reduction in mass production.

Another disadvantage with the InGaN/InGaN multiple-quantum-well active layer is that the performance and properties of a light emitting diode including the active layer are sensitive to a small change in, the indium composition of the InGaN barrier layer 13a' thus making the mass production of the diode difficult.

Trimethy indium (TMIn) is mainly used as a precursor for indium. It has a melting point of 88° C. and is solid at room temperature. Thus, growing a material with the precursor maintained at a constant composition is relatively difficult compared to other precursors. Particularly, a small change in the indium composition in the barrier layers 13a' is difficult to detect even by a nondestructive measurement system, such as a PL (photoluminescence) or XRD (X-ray Diffraction) system, and thus, causes a difficulty in quality control and has a great effect on the production of prior products.

As described above, the existing typical InGaN/GaN multiple-quantum-well layer and InGaN/InGaN multiple-quantum-well layer have advantages and disadvantages, which are contrary to each other.

DISCLOSURE OF INVENTION

Technical Problem

Accordingly, the present invention has been made to solve the above-described shortcomings occurring in the prior art, and an object of the present invention is to provide a III-nitride compound semiconductor light emitting device with improved performance, in which the barrier layer(s) of a multiple-quantum-well active layer have a sandwich structure of InGaN/GaN/InGaN, not a single-layer structure, so that the disadvantages of the prior multiple-quantum-well layer stacks can be overcome and only their advantages can be taken.

Technical Solution

To achieve the above object, the present invention provides a III-nitride compound semiconductor light emitting device comprising an active layer with multiple-quantum wells interposed between a n-$In_xAl_yGa_zN(x+y+z=1$, $0 \leq x<1$, $0 \leq y < 1, 0 < z \leq 1$) layer and a p-$In_xAl_yGa_zN(x+y+z=1, 0 \leq x < 1, 0 \leq y < 1, 0 < z \leq 1$) layer, in which the active layer comprises an alternate stacking of sandwich barrier layer(s) and quantum-well layers made of $In_xGa_{1-x}N(0.05 < x < 1)$, each of the sandwich barrier layer(s) comprising a first outer barrier layer of $In_aGa_{1-a}N$ ($0 < a \leq 0.05$), a middle barrier layer of $Al_yGa_{1-y}N$ ($0 \leq y < 1$) formed on the first outer barrier layer and a second outer barrier layer of $In_bGa_{1-b}N(0 < b \leq 0.05)$ formed on the middle barrier layer.

Preferably, each of the quantum-well layers is equal to or below 60 Å in thickness, and each of the sandwich barrier layer(s) is equal to or below 300 Å in thickness. Also, the ratio of the sum of the thickness of the first outer barrier layer and the thickness of the second outer barrier layer, (t1), to the thickness of the middle barrier layer, (t2), i.e., t1/t2, is preferably 1/50 to 1/2.

The lowest layer of the active layer, which is in contact with the n-$In_xAl_yGa_zN$ layer, may be the first of the quantum well layers made of $In_xGa_{1-x}N$, and the uppermost layer of the active layer, which is in contact with the p-$In_xAl_yGa_zN$ layer, may be the last of the quantum well layers made of $In_xGa_{1-x}N$.

Alternately, the lowest layer of the active layer, which is in contact with the n-$In_xAl_yGa_zN$ layer, and the uppermost layer of the active layer, which is in contact with the p-$In_xAl_yGa_zN$ layer, may also be the middle barrier layer of the sandwich barrier layer(s).

Advantageous Effects

According to the present invention, a high-efficiency/high-output light emitting device with high-current and high-temperature properties can be obtained, and it is possible to easily achieve a high-efficiency green light emission at a wavelength equal to or over 500 nm, and high-efficiency near UV light emission.

BRIEF DESCRIPTION OF THE DRAWINGS

FIGS. 1 to 3 are drawings illustrating a III-nitride compound semiconductor light emitting device according to the prior art.

FIG. 4 is an energy band diagram illustrating a III-nitride compound semiconductor light emitting device according to a first embodiment of the present invention.

FIG. 5 illustrates the operational principle of an energy band gap structure in the sandwich barrier layers according to the present invention.

FIG. 6 is a drawing of experimental graphs showing the comparison of the operating current-to-light emission properties of the inventive III-nitride compound semiconductor green light emitting device of FIG. 4 with the III-nitride compound semiconductor device of FIG. 3.

FIG. 7 is an energy band diagram illustrating a III-nitride compound semiconductor light emitting device according to the present invention.

MODE FOR THE INVENTION

Figure 1:
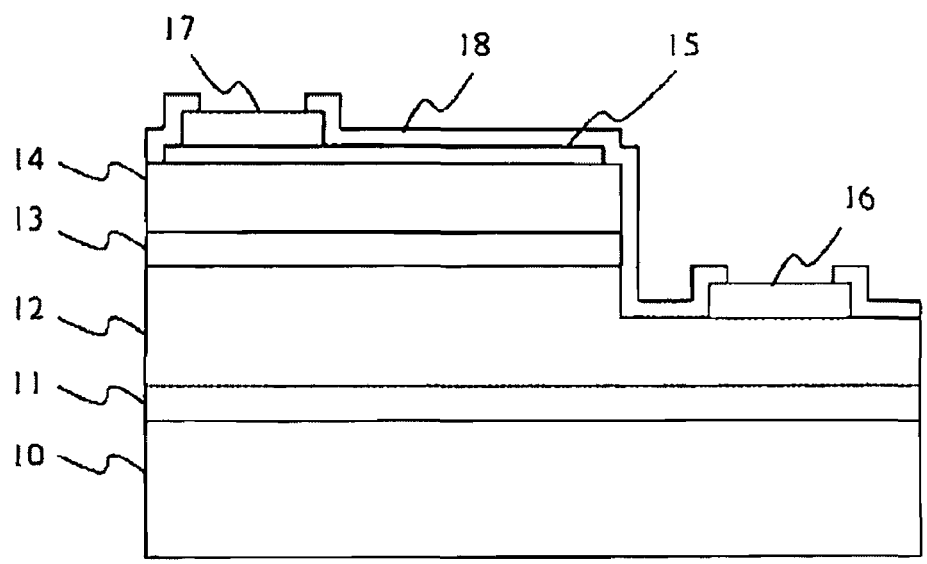
Figure 2:
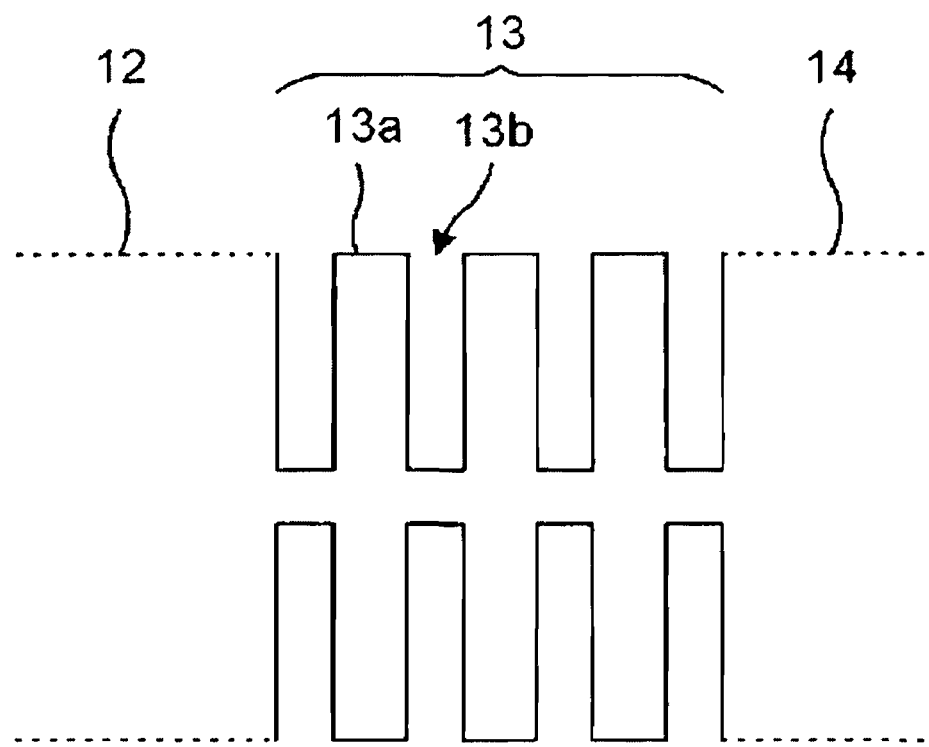

Hereinafter, the present invention will be described in detail with reference to the accompanying drawings. Only the characteristic features of the present invention will be shown in order to avoid a duplicate description identical to that of the prior art. In the drawings, the same reference numerals as those of the prior art represent elements performing the same functions, and a duplicate description thereof will be omitted.

The following embodiments are provided for a better understanding of the present invention and it will be obvious to a person skilled in the art that many modifications to these embodiments can be made within technical concept of the present invention. Accordingly, it should not be construed that the scope of the present invention is not limited to or by these embodiments.

Embodiment 1

FIG. 4 is an energy band diagram illustrating a III-nitride compound semiconductor light emitting device according to the first embodiment of the present invention.

Referring to FIG. 4, the multiple-quantum-well active layer 113 comprises an alternate stacking of the quantum well layers 113b made of $In_xGa_{1-x}N(0.05 < x < 1)$ and the sandwich barrier layers 113a formed on the quantum well layers 113b.

The sandwich barrier layers 113a have a sandwich structure comprising the first outer barrier layer 201 formed of $In_aGa_{1-a}N(0 < a \leq 0.05)$ on the quantum well layers 113b, a middle barrier layer 202 formed of $Al_yGa_{1-y}N(0 \leq y < 1)$ on the first outer barrier layer 201, and the second outer barrier layer 203 formed of $In_bGa_{1-b}N(0 < b \leq 0.05)$ on the middle barrier layer 202.

The lowest layer of the active layer 113, which is in contact with the n-$In_xAl_yGa_zN$ layer 12, is the first of the quantum well layers 113b, and the highest layer of the active layer 113, which is in contact with the p-$In_xAl_yGa_zN$ layer 14, is the last of the quantum well layers 113b.

Similarly to the quantum well layers 113b, the outer barrier layers 201 and 202 are made of InGaN, however, they have a lower indium content than that of the quantum well layers 113b, which indicates a larger energy band gap than that of the quantum well layers 113b. The more the amount of addition of indium to GaN, the smaller the energy band gap.

As shown in FIG. 5, GaN that is the material of the middle barrier layer 202 is larger in energy band gap than the InGaN barrier layers 13b' by ΔEc, and thus, provides a higher energy barrier. This reduces the overflow of electrons in high-current and high-temperature operations, thus making light emission stable. For example, if the content of indium in the InGaN barrier layers is 5%, the energy bandgap is then 3.28, indicating a ΔEc of 0.12 eV, and thus, the effect of blocking the overflow of electrons as much is provided. This provides an increase in the efficiency of recombination between electrons and holes.

Furthermore, the outer barriers 201 and 203 contribute to produce high-quality InGaN well layers 113b by complementing the GaN middle barrier layer 202 which is low in quality due to growth at low temperature, and by providing homogeneous material growth surfaces for the InGaN well layers 113b to be subsequently grown.

In addition, the present invention allows control of the thickness of the middle barrier layer 202, the thickness of outer barrier layers 201 and 202 and the content of indium, so as to optimize the strain of the active layer 113. Thus, the present invention is more advantageous to optimize the strain of the active layer as compared to the prior art since it has a greater freedom in controlling the active layer 113 as compared to the prior InGaN/GaN or InGaN/InGaN multiple-quantum-well active layer.

The strain of the active layer 113 is particularly important since it determines the direction and intensity of piezoelectric field. When the piezoelectric field in the active layer 113 occurs, the bending of energy band in the well layers 113b will occur, resulting in stark shifts. Then, the effective bandgap will eventually become narrow so that the light emission wavelength will show a tendency to move toward long wavelength, and the wave functions of the conduction band and the valence band will be separated in the quantum well layers 113b, resulting in a reduction in the electron-hole recombination efficiency. For this reason, the optimization of the strain of the active layer 113 is very important to increase the electron-hole recombination efficiency.

The strain of the active layer 113 can be controlled by the thickness of the quantum well layers 113b and the content of indium (In), but control of the strain by the quantum well layers 113b influences the performance of the device very sensitively. For this reason, control of the strain by the sandwich barrier layers 113a is more effective.

For a device emitting light at a long wavelength equal to or over 500 nm, the content of indium in the quantum well layers 113b is high, in which case it is very important to optimize the strain of the active layer. The structure of the active layer according to the present invention is very advantageous in this case.

The thickness of each of the quantum well layers 113b is preferably equal to or below 60 Å and the thickness of each of the sandwich barrier layers is preferably equal to or below 300 Å. And, the ratio of the sum of the thickness of the first outer barrier layer 201 and the second outer barrier layer 203, (t1), to the thickness of the middle layer 202, (t2), i.e., t1/t2, is preferably 1/50 to 1/2. The composition ratio of indium (In) in the outer barrier layers 201 and 203, i.e., b×100, is preferably equal to or below 10%, and more preferably equal to or below 5%.

When Al is added to the middle barrier layer 202 in order to increase the energy barrier (h), the overflow of electrons in high-current operations and high-temperature operations can be further inhibited, thus providing a light emitting device with more improved performance. This structure will be actually difficult to achieve without the outer barrier layers 201 and 203 with a sandwich structure. This is because if the AlGaN barrier layer is grown directly on the InGaN well layer 113b, the lattice constant mismatch will be very increased, thus making it very difficult to obtain a multiple-quantum-well structure with high-quality by alternately stacking the AlGaN layers. However, if the InGaN outer barrier layers 201 and 203 are formed, the lattice constant mismatch can be reduced, and surfaces for the growth of a homogeneous material can be provided for the InGaN well layers 113b to be subsequently grown so that the InGaN well layers 113b can be grown with high quality.

The structure of the active layer 113 in which the middle barrier layer 202 contains aluminum Al so as to further increase the energy barrier (h) is very suitable to achieve a device which operates in a range of high electron activation energy and emits light at a near UV region around 400 nm.

FIG. 6 is an experimental graphic representation showing the comparison of the current-to-light emission output characteristics of the inventive III-nitride compound semiconductor green light emitting device shown in FIG. 4 with the prior III-nitride compound semiconductor green light emitting device shown in FIG. 3.

For comparison in the same conditions, a lightemission wavelength of 525 nm was selected in both the two cases. As can be seen from FIG. 6, at a standard operating current of 20 □, the green LED according to the present invention was about 17% higher in light output than that of the prior green LED having an InGaN or InGaN multiple-quantum-well layer. Particularly, as shown in FIG. 6, the LED according to the present invention showed the curve of a relatively linear increase in light output with an increase in operating current, whereas the prior LED with the InGaN single barrier layer showed the curve of a slow saturation in light output with an increase in operating current. An increase in the linearity of the light output curve means that the internal quantum efficiency of the device is maintained almost constant even when the operating current increases, leading to an increase in operating temperature. Accordingly, the increased linearity in the light output curve is advantageous for high-current operations and provides increases in the stability and reliability of the device.

Embodiment 2

FIG. 7 is an energy band diagram illustrating a III-nitride semiconductor light emitting device according to a second embodiment of the present invention.

As shown in FIG. 4, the lowest layer of the active layer 113, which is in contact with the n-$In_xAl_yGa_zN$ layer 12, and the highest layer of the active layer 113, which is in contact with the p-$In_xAl_yGa_zN$ layer 14, must not be necessarily be the quantum well layers 113b. As shown in FIG. 7, the lowest layer of the active layer 113, which is in contact with the n-$In_xAl_yGa_zN$ layer 12, and the highest layer of the active layer 113, which is in contact with the p-$In_xAl_yGa_zN$ layer 14, may also be the middle barrier layers 202 of the sandwich barrier layers 113a.

The structure shown in FIG. 7 is characterized in that all the InGaN quantum well layers can grow on surfaces provided as the InGaN outer barrier layers in the same conditions. Thus, this structure has advantages is that it is more advantageous in achieving an uniform multiple-well active layer and can provide an improvement in the half width of light emission wavelength.

Fabrication Method

Hereinafter, a method for fabricating the III-nitride compound semiconductor light emitting device shown in FIG. 4.

Deposition is performed by a metal organic chemical vapor deposition (MOCVD) process, and as a gallium precursor, trimethylgallium (TMGa) is used. As an aluminum precursor, trimethylaluminum (TMAl) is used, and as an indium precursor, trimethylindium (TMIn) is used. As a nitrogen precursor, ammonia ($NH_3$) is used.

As the substrate 10, a (0002) sapphire substrate is used. On the substrate, the buffer layer 11 is formed to a thickness of 300 Å at 600° C. in order to reduce the lattice mismatch between the substrate and the GaN layer. Then, at an increased temperature of 1050° C. under an ammonia atmosphere, an n-GaN as the n-$In_xAl_yGa_zN$ layer is grown to a thickness of 4 □ using silane gas ($SiH_4$) as the precursor of Si dopant.

And, at a decreased temperature of 730° C., the first well layer 113b of InGaN is grown to a thickness of 25 Å. Then, at a reduced molar ratio of TMIn, the first outer barrier layer 201 of InGaN is grown to a thickness of 20 Å, after which the middle barrier layer 202 of GaN is formed to a thickness of 120 Å, followed by formation of the second outer barrier layer 203 of InGaN to a thickness of 20 Å.

Thereafter, the second well layer 113a is formed, and the above-described procedures are repeated to grow a total of five quantum well layers. Subsequently to the formation of the fifth InGaN well layer, a GaN cap layer is grown to a thickness of 100 Å. Then, at an increased temperature of 1050° C., a p-GaN layer as the p-$In_xAl_yGa_zN$ layer 12 is grown to a thickness of 2000 Å. In this respect, nitrogen is used as carrier gas, and $Cp_2Mg$ is used as p-type dopant.

The invention claimed is:

1. A III-nitride compound semiconductor light emitting device comprising an active layer with the multi-quantum wells interposed between an n-$In_xAl_yGa_zN$ (x+y+z=1, 0≦x<1, 0≦y<1, 0<z≦1)layer and a p-$In_xAl_yGa_zN$(x+y+z=1, 0≦x<1, 0≦y<1, 0<z≦1) layer, wherein the active layer comprises an alternate stacking of a quantum-well layer made of $In_xGa_{1-x}N(0.05<x<1)$ and a sandwich barrier layer, the sandwich barrier layer comprising a first outer barrier layer of $In_aGa_{1-a}N(0<a\leqq0.05)$, a middle barrier layer of $Al_yGa_{1-y}N$ ($0\leqq y<1$) formed on the first outer barrier layer and a second outer barrier layer of $In_bGa_{1-b}N(0<b\leqq0.05)$ formed on the middle barrier layer, and wherein the middle barrier layer has a bandgap energy greater than those of the first and second outer barrier layers.

2. The III-nitride compound semiconductor light emitting device of claim 1, wherein the quantum-well layers are equal to or below 60 Å in thickness, and the sandwich barrier layer is equal or below 300 Å in thickness, and the ratio of the sum of the thickness of the first outer barrier layer and the thickness of the second outer barrier layer, (t1), to the thickness of the middle barrier layer, (t2), i.e., t1/t2, is 1/50 to 1/2.

3. The III-nitride compound semiconductor fight emitting device of claim 1, wherein the lowest layer of the active layer, which is in contact with the $n-In_xAl_yGa_zN$ layer, is the first of the quantum well layers made of $In_xGa_{1-x}N$, and the uppermost layer of the active layer, which is in contact with the $p-In_xAl_yGa_zN$ layer, is the last of the quantum well layers made of $In_xGa_{1-x}N$.

4. The III-nitride compound semiconductor light emitting device of claim 1, wherein the lowest layer of the active layer, which is in contact with the $n-In_xAl_yGa_zN$ layer, and the uppermost layer of the active layer, which is in contact with the $p-In_xAl_yGa_zN$ layer, are composed of the middle barrier layer of the sandwich barrier layer.

* * * * *

UNITED STATES PATENT AND TRADEMARK OFFICE
CERTIFICATE OF CORRECTION

| | |
|---|---|
| PATENT NO. | : 7,547,909 B2 |
| APPLICATION NO. | : 10/597607 |
| DATED | : June 16, 2009 |
| INVENTOR(S) | : Joongseo Park |

It is certified that error appears in the above-identified patent and that said Letters Patent is hereby corrected as shown below:

Title Page

Item (54)

Please delete "III_NITRIDE COMPOUND ICE SEMICONDUCTOR LIGHT EMITTING DEV" and insert --III-NITRIDE COMPOUND SEMICONDUCTOR LIGHT EMITTING DEVICE--

Item (22)

Please delete "March 5, 2005" and insert --February 5, 2005--

Item (86)

For the filing or '371c' date, delete "August 1, 2006" and insert --August 3, 2006--

Signed and Sealed this

Fifteenth Day of September, 2009

David J. Kappos
*Director of the United States Patent and Trademark Office*

UNITED STATES PATENT AND TRADEMARK OFFICE
CERTIFICATE OF CORRECTION

PATENT NO. : 7,547,909 B2  Page 1 of 1
APPLICATION NO. : 10/597607
DATED : June 16, 2009
INVENTOR(S) : Joongseo Park It is certified that error appears in the above-identified patent and that said Letters Patent is hereby corrected as shown below:

Title Page, Item (54) and Column 1, lines 1-3

Please delete "III_NITRIDE COMPOUND ICE SEMICONDUCTOR LIGHT EMITTING DEV" and insert --III-NITRIDE COMPOUND SEMICONDUCTOR LIGHT EMITTING DEVICE--

Title Page, Item (22)

Please delete "March 5, 2005" and insert --February 5, 2005--

Title Page, Item (86)

For the filing or '371c' date, delete "August 1, 2006" and insert --August 3, 2006--

This certificate supersedes the Certificate of Correction issued September 15, 2009.

Signed and Sealed this

Sixth Day of October, 2009

David J. Kappos
*Director of the United States Patent and Trademark Office*